United States Patent
Fink et al.

(10) Patent No.: US 11,606,482 B2
(45) Date of Patent: *Mar. 14, 2023

(54) METHODS FOR CAMERA MOVEMENT COMPENSATION

(71) Applicant: WEST TEXAS TECHNOLOGY PARTNERS, LLC, Waco, TX (US)

(72) Inventors: Ryan Fink, Vancouver, WA (US); Gary Peck, Portland, OR (US); Bryan Ransil, San Francisco, CA (US)

(73) Assignee: WEST TEXAS TECHNOLOGY PARTNERS, LLC, Waco, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/221,745

(22) Filed: Apr. 2, 2021

(65) Prior Publication Data
US 2021/0227103 A1    Jul. 22, 2021

Related U.S. Application Data

(63) Continuation of application No. 16/512,650, filed on Jul. 16, 2019, now Pat. No. 10,999,480, which is a continuation of application No. 16/146,334, filed on Sep. 28, 2018, now Pat. No. 10,412,272, which is a continuation of application No. 14/806,926, filed on Jul. 23, 2015, now Pat. No. 10,116,839.

(60) Provisional application No. 60/037,239, filed on Jan. 27, 1997.

(51) Int. Cl.
*H04N 5/14* (2006.01)
*H04N 5/232* (2006.01)
*H04N 5/33* (2023.01)

(52) U.S. Cl.
CPC ......... *H04N 5/144* (2013.01); *H04N 5/23258* (2013.01); *H04N 5/23261* (2013.01); *H04N 5/23277* (2013.01); *H04N 5/33* (2013.01)

(58) Field of Classification Search
CPC .............. H04N 5/144; H04N 5/23258; H04N 5/23261; H04N 5/23277; H04N 5/33
See application file for complete search history.

(56) References Cited

U.S. PATENT DOCUMENTS

| | | | |
|---|---|---|---|
| 10,469,749 B1 * | 11/2019 | Linzer | ................ H04N 5/23277 |
| 2002/0113901 A1 | 8/2002 | Osberger | |
| 2006/0028562 A1 | 2/2006 | Schmitz et al. | |
| 2012/0120264 A1 | 5/2012 | Lee et al. | |

(Continued)

*Primary Examiner* — Mekonnen D Dagnew
(74) *Attorney, Agent, or Firm* — Whiteford, Taylor & Preston, LLP; Gregory M. Stone

(57) ABSTRACT

A method, system, apparatus, and/or device for adjusting or removing frames in a set of frames. The method, system, apparatus, and/or device may include: associating a first frame of a set of frames with motion data that is captured approximately contemporaneously with the first frame; when a sampling rate of the motion data is greater than a frame rate of the set of frames, aggregating a first sample of the motion data captured at the first frame and a second sample of the motion data captured between the first frame and a second frame of the set of frames to obtain a movement value; when the movement value does not exceed a first threshold value, accepting the first frame from the set of frames; and when the movement value exceeds the first threshold value, rejecting the first frame from the set of frames.

17 Claims, 6 Drawing Sheets

(56) References Cited

U.S. PATENT DOCUMENTS

| | | |
|---|---|---|
| 2012/0148216 A1* | 6/2012 | Pavagada ............... H04N 5/772 386/278 |
| 2013/0021491 A1 | 1/2013 | Lee et al. |
| 2013/0076921 A1* | 3/2013 | Owen ................ H04N 5/23267 348/208.4 |
| 2013/0329062 A1 | 12/2013 | Zhou et al. |
| 2015/0138379 A1 | 5/2015 | Auberger et al. |
| 2018/0376045 A1* | 12/2018 | Weckel ................... G06T 7/262 |

\* cited by examiner

METHODS FOR CAMERA MOVEMENT COMPENSATION

CROSS-REFERENCE TO RELATED APPLICATION

This application is a continuation of U.S. patent application Ser. No. 16/512,650, filed Jul. 16, 2019, which is a continuation of U.S. patent application Ser. No. 16/146,334, filed Sep. 28, 2018, which is a continuation of U.S. patent application Ser. No. 14/806,926, filed Jul. 23, 2015, which claims priority to benefit of U.S. Provisional Application No. 60/037,239, filed on Aug. 14, 2014, which are hereby incorporated by reference for all purposes.

BACKGROUND

The present disclosure relates generally to object and motion detection by a camera-equipped computer system. In particular, methods of compensating for camera movement while performing object recognition and gesture detection computer system are described.

As wearable technology such as the Google® Glass device continues to develop, so do new ways of interacting with such devices. One possible method of interaction is the use of gestures—motions made by the user with their fingers, hands, and/or arms—that allow the user to manipulate information displayed on a wearable device's display. Wearable devices typically position a display within the user's field of vision, allowing information to effectively be superimposed on whatever the user is viewing. By incorporating visual sensors into the wearable device, the user can make gestures within his or her field of view that appear, to the user, to manipulate the superimposed images. The accurate detection of such gestures requires the device to be able to distinguish between portions of the scene viewed by the visual sensor that are moving from those that are stationary. However, by their very nature, wearable devices are subject to frequent movement as the wearer goes about his or her daily routines. This presents a challenge to gesture detection; as the camera moves with the device movement, everything in the captured image appears to move, rendering the detection of a gesture apart from the rest of the scene problematic.

Known methods of gesture detection and object recognition, then, are not entirely satisfactory for the range of applications in which they are employed. For example, existing methods require the user to focus on holding still while making gestures or risk having a gesture either go unrecognized or be misinterpreted. In addition, employing conventional methods may result in the apparent motion of stationary objects resulting from camera movement being interpreted as a gesture.

Thus, there exists a need for methods that improve upon and advance the design of known methods of image capture for gesture detection and recognition. Examples of new and useful methods relevant to the needs existing in the field are discussed below.

SUMMARY

The present disclosure is directed to methods and systems for camera movement compensation for gesture detection and object recognition. The disclosed systems preferably use a camera in conjunction with a motion sensing device. In some examples, the methods and systems analyze motion data associated with the sequential frames of a video stream and reject those frames where the detected camera movement exceeds a predetermined threshold. In other examples, the methods and systems use the motion data and portions of immediate previous frames to adjust a frame where the detected camera movement exceeds the predetermined threshold to create an adjusted frame that compensates for the detected camera movement. In still other examples, frames are adjusted if the detected camera movement exceeds a first threshold and rejected if the detected movement exceeds a second threshold. In applications where a consistent data stream is required, rejected frames may be replaced with duplicates of the most recent immediately adjacent frame that has been accepted or adjusted.

DETAILED DESCRIPTION OF THE INVENTION

The disclosed methods will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various methods are provided. Related features in the examples may be identical, similar, or dissimilar in different examples. For the sake of brevity; related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same as or similar to the specific portrayal of a related feature in any given figure or example.

Figure 1:
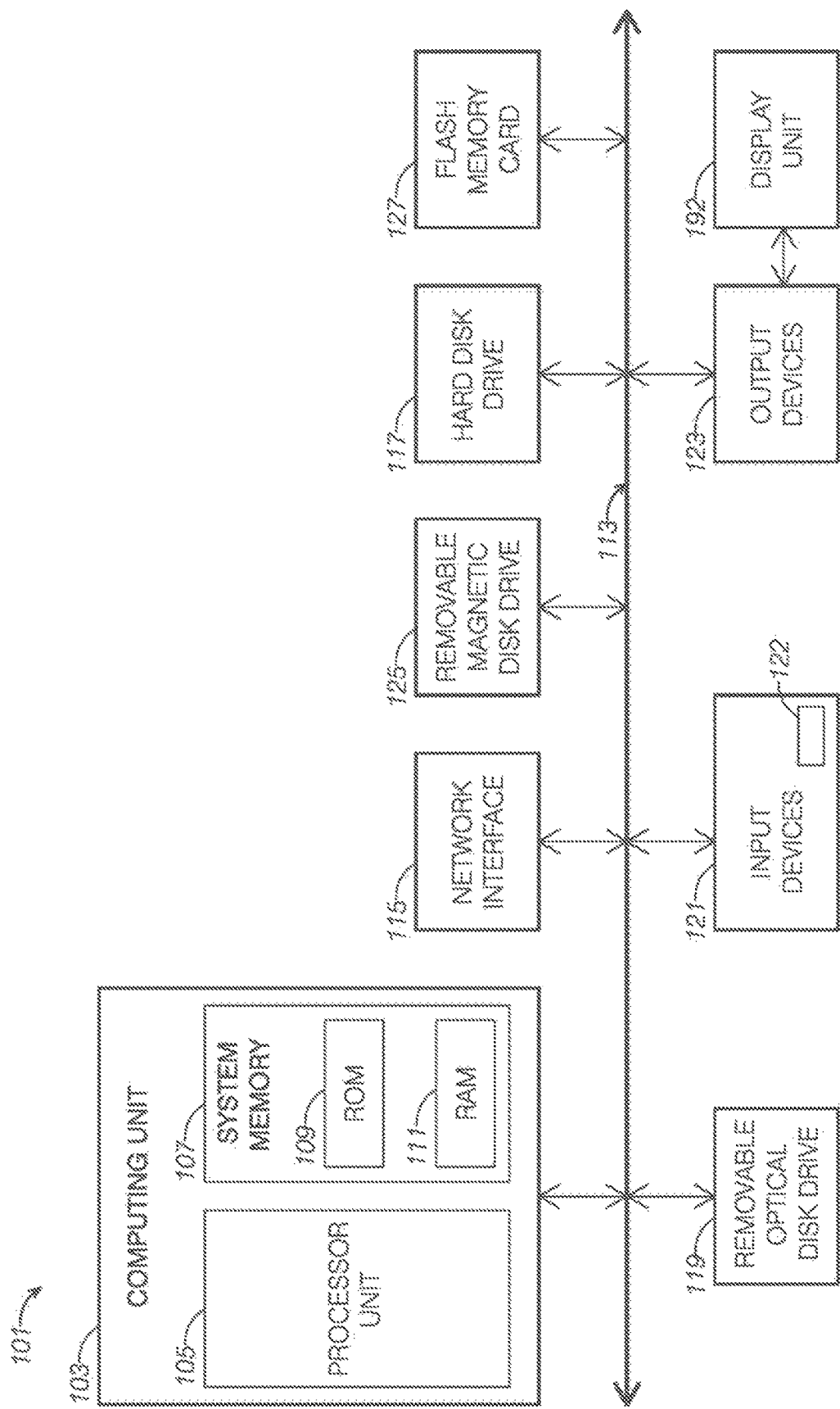
FIG. 1 shows a schematic view of an example of a programmable computing device.
Figure 2:
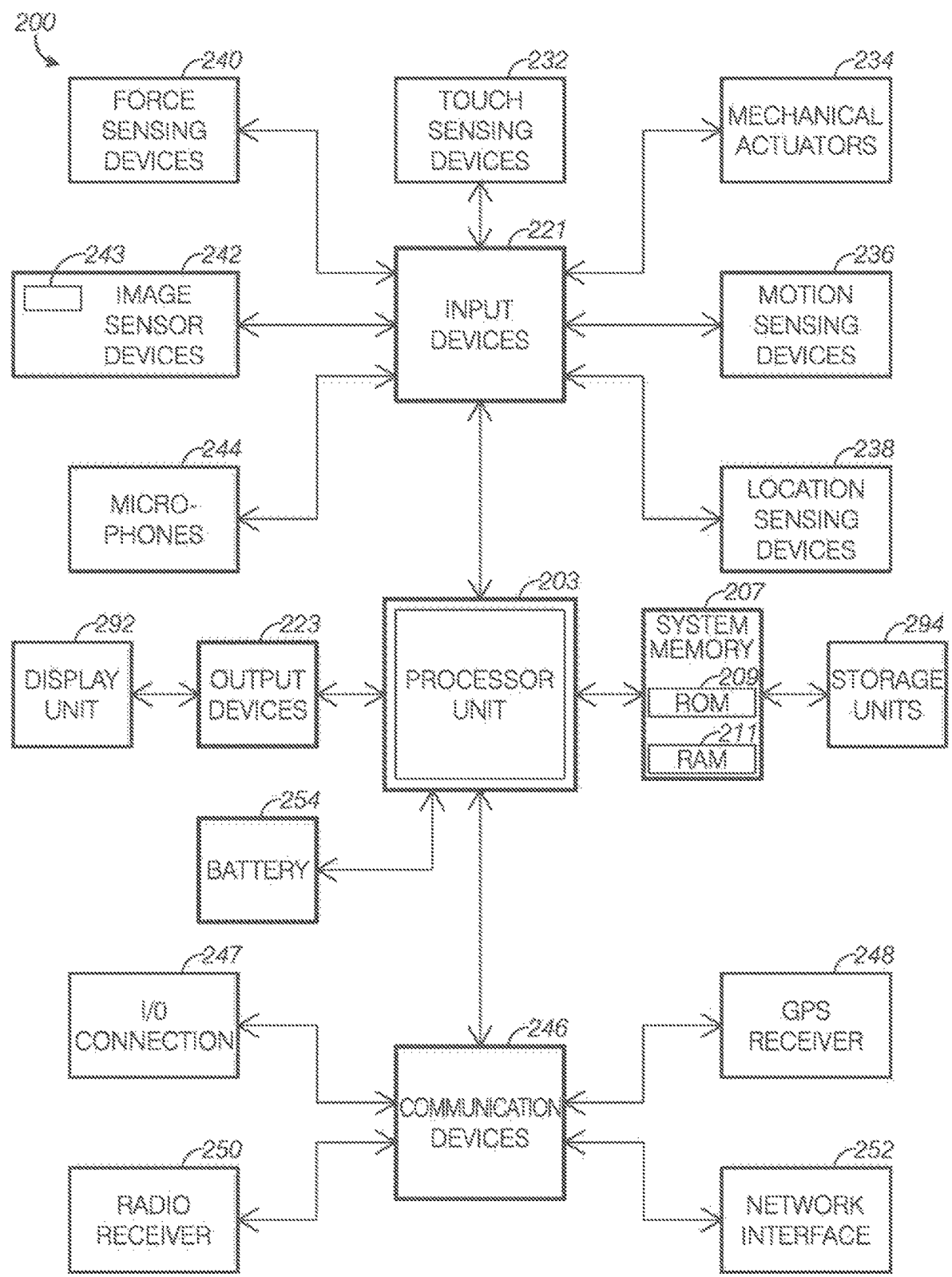
FIG. 2 shows a schematic view of an example of a mobile electronic device.
Figure 3:
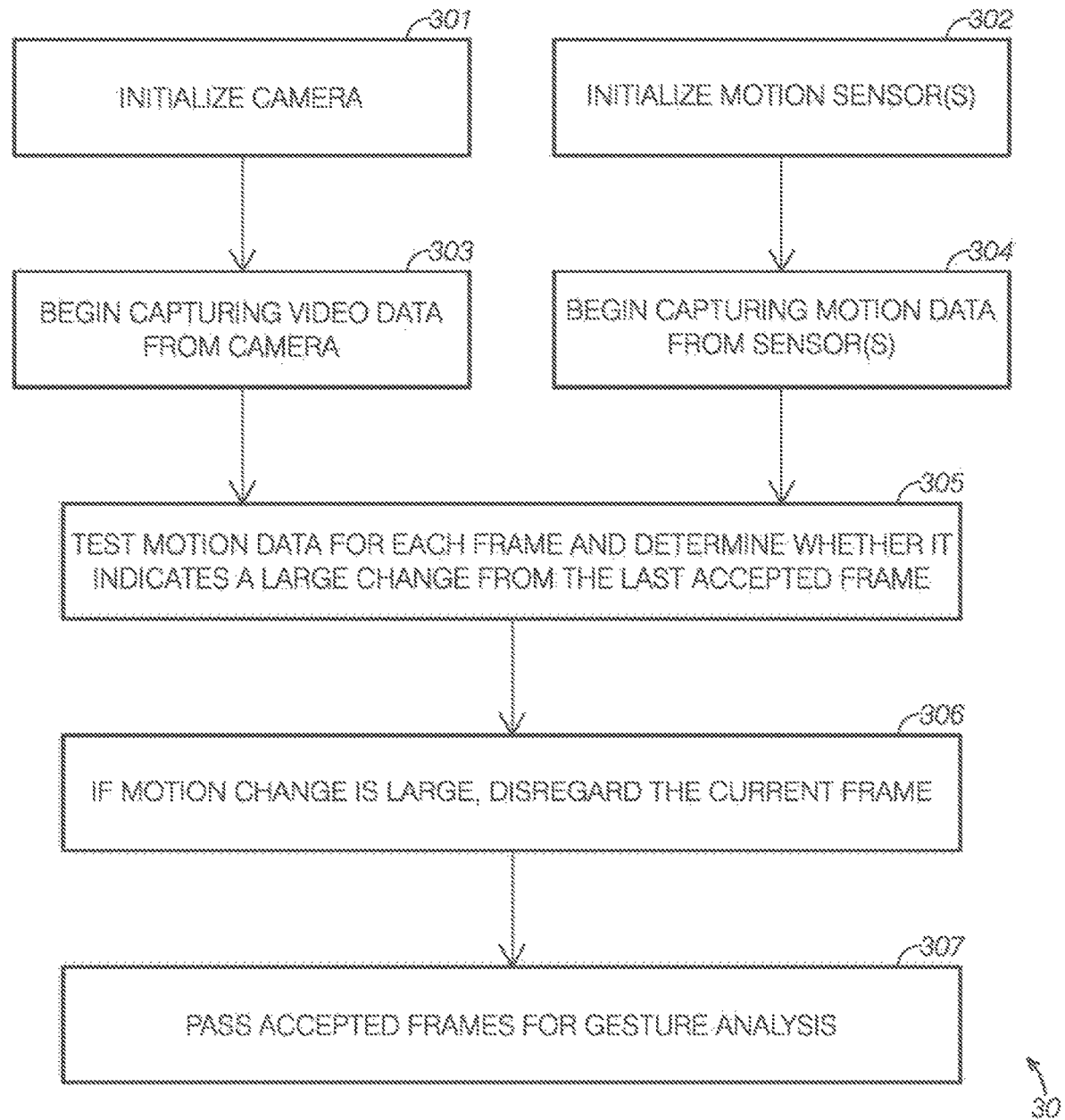
FIG. 3 is a flowchart of a first example of a method for compensating for camera movement for gesture detection and object recognition by a moving camera.

With reference to FIGS. 1-3, a first example of a method, method 30, will now be described. Method 30 functions to detect when a camera that is to be used for gesture recognition or object detection is moving excessively and is thus liable to cause erroneous recognition and interpretation of gestures. The method then modifies the camera image stream in a way calculated to minimize the likelihood of these errors. Additionally or alternatively, method 30 can be used to provide an image stream to any application that requires video that is relatively motion-free.

Method 30 addresses many of the shortcomings existing with conventional methods of object and gesture recognition. The accuracy of detecting moving objects in the field of view of an implementing device's camera is improved by ignoring camera images captured while the device is in motion and the amount of motion between successive frames is large. For example, momentary jumps or twitches in the video where the camera goes off frame and then returns can be ignored to provide a more accurate video capture of a particular gesture for subsequent processing. Alternatively, relatively minor changes in perspective can be corrected using motion data to correct the moved frame so as to provide a video stream that appears to be relatively stationary. In both cases, the result is a video stream that allows for easier and more accurate gesture identification and recognition, without the need for the user to hold particularly still It will be appreciated that various disclosed examples may be implemented using electronic circuitry configured to perform one or more functions. For example, with some embodiments of the invention, the disclosed examples may be implemented using one or more application-specific integrated circuits (ASICs). More typically, however, components of various examples of the invention will be implemented using a programmable computing device executing firmware or software instructions, or by some combination of purpose-specific electronic circuitry and firmware or software instructions executing on a programmable computing device.

Accordingly, FIG. 1 shows one illustrative example of a computer, computer 101, which can be used to implement various embodiments of the invention. Computer 101 may be incorporated within a variety of consumer electronic devices, such as personal media players, cellular phones, smart phones, personal data assistants, global positioning system devices, smart eyewear, smart watches, other computer wearables, and the like.

As seen in this figure, computer 101 has a computing unit 103. Computing unit 103 typically includes a processing unit 105 and a system memory 107. Processing unit 105 may be any type of processing device for executing software instructions, but conventional be a microprocessor device. System memory 107 may include both a read-only memory (ROM) 109 and a random access memory (RAM) 111. As will be appreciated by those of ordinary skill in the art, both read-only memory (ROM) 109 and random access memory (RAM) 111 may store software instructions to be executed by processing unit 105.

Processing unit 105 and system memory 107 are connected, either directly or indirectly, through a bus 113 or an alternate communication structure to one or more peripheral devices. For example, the processing unit 105 or system memory 107 may be directly or indirectly connected to additional memory storage, such as a hard disk drive 117, a removable optical disk drive 119, a removable magnetic disk drive 125, and a flash memory card 127. Processing unit 105 and system memory 107 also may be directly or indirectly connected to one or more input devices 121 and one or more output devices 123.

Output devices 123 may include, for example, a monitor display, an integrated display, television, printer, stereo, or speakers. Input devices 121 may include, for example, a keyboard, touch screen, a remote control pad, a pointing device (such as a mouse, touchpad, stylus, trackball, or joystick), a scanner, a microphone, or a camera.

More specifically, in the presently described gesture recognition systems, input devices 121 include at least a 2D camera 122 (e.g., a light camera, a thermographic camera, etc.). In one example, 2D camera 122 is a visible light digital camera. The visible light digital camera uses an optical system including a lens and a variable diaphragm to focus light onto an electronic image pickup device. The visible light digital camera can be a compact digital camera, a bridge camera, a mirrorless interchangeable-lens camera, a modular camera, a digital single-lens reflex camera, digital single-lens translucent camera, line-scan camera, etc. Further, it will be appreciated that the visible light digital camera can be any known or yet to be discovered visible light digital camera. The camera is ideally mounted on a moveable base, e.g. embedded in a headset or glasses, mounted to a vehicle, strapped to a person's limb, head, or clothing, as part of a mobile phone, or any other usage that makes the camera moveable, including hand holding.

As mentioned above, 2D camera 122 can additionally or alternatively be a thermographic camera or infrared (IR) camera. The IR camera can detect heat radiation in a way similar to the way an ordinary camera detects visible light. This makes IR cameras useful for gesture recognition in "normal light", "low light", and/or "no light" conditions. The IR camera can include cooled infrared photodetectors (e.g. indium antimonide, indium arsenide, mercury cadmium telluride, lead sulfide, lead selenide, etc.) and/or uncooled infrared photodetectors (e.g., vanadium oxide, lanthanum barium manganite, amorphous silicon, lead zirconate titanate, lanthanum eloped lead zirconate titanate, lead scandium tantalate, lead lanthanum titanate, lead titanate, lead zinc niobate, lead strontium titanate, barium banumn strontium titanate, antimony sulfoiodide, polyvinylidene difluoride, etc.). Further, it will be appreciated that the IR camera can be any known or yet to be discovered thermographic camera.

Returning to FIG. 1, computing unit 103 can be directly or indirectly connected to one or more network interfaces 115 for communicating with a network. This type of network interface 115, also sometimes referred to as a network adapter or network interface card (NIC), translates data and control signals from computing unit 103 into network messages according to one or more communication protocols, such as the Transmission Control Protocol (TCP), the Internet Protocol (IP), and the User Datagram Protocol (UDP). These protocols are well known in the art, and thus will not be discussed here in more detail. A network interface 115 may employ any suitable connection agent for connecting to a network, including, for example, a wireless transceiver, a power line adapter, a modem, or an Ethernet connection.

It should be appreciated that, in addition to the input, the output, and the storage peripheral devices specifically listed above, the computing device may be connected to a variety of other peripheral devices, including some that may perform input, output and storage functions, or some combination thereof. For example, the computer 101 may be connected to a digital music player, such as an IPOD® brand digital music player or iOS or Android-based smartphone. As known in the art, this type of digital music player can serve as both an output device for a computer (e.g., outputting music from a sound file or pictures from an image file) and a storage device.

In addition to a digital music player, computer 101 may be connected to or otherwise include one or more other peripheral devices. In one example, computer 101 may be connected to or other include a telephone. The telephone may be, for example, a wireless "smartphone," such as those featuring the Android or iOS operating systems. As known in the art, this type of telephone communicates through a wireless network using radio frequency transmissions. In addition to simple communication functionality, a "smartphone" may also provide a user with one or more data management functions, such as sending, receiving and viewing electronic messages (e.g., electronic mail messages, SMS text messages, etc.), recording or playing back sound files, recording or playing back image tiles (e.g., still picture or moving video image tiles), viewing and editing files with text (e.g., Microsoft Word or Excel files, or Adobe Acrobat files), etc. Because of the data management capability of this type of telephone, a user may connect the telephone with computer 101 so that their maintained data may be synchronized.

In another example, computer 101 may be connected to or otherwise include an eyewear article. The eyewear article may be, for example, a "smart" eyewear article, such as a wearable computing device like Google® Glass.

The "smart" eyewear technologies are particularly suited to the display of "augmented reality" displays. "Augmented reality" displays comprise a computer-generated graphical display laid over a portion of a user's or mobile device's natural field of vision. These "augmented reality" displays allow a user to view computer-generated images including data related to objects in their natural field of vision. Augmented reality displays may include any display including both natural and computer-generated elements.

Of course, still other peripheral devices may be included with or otherwise connected to a computer 101 of the type illustrated in FIG. 1, as is well known in the art. In some cases, a peripheral device may be permanently or semi-permanently connected to computing unit 103. For example, with many computers, computing unit 103, hard disk drive 117, removable optical disk drive 119 and a display are semi-permanently encased in a single housing.

Still, other peripheral devices may be removably connected to computer 101, however. Computer 101 may include, for example, one or more communication ports through which a peripheral device can be connected to computing unit 103 (either directly or indirectly through bus 113). These communication ports may thus include a parallel bus port or a serial bus port, such as a serial bus port using the Universal Serial Bus (USB) standard or the IEEE 1394 High-Speed Serial Bus standard (e.g., a Firewire port). Alternately or additionally, computer 101 may include a wireless data "port," such as a Bluetooth® interface, a Wi-Fi interface, an infrared data port, or the like.

It will be appreciated that a computing device employed according to various examples of the invention may include more components than the computer 101 illustrated in FIG. 1, fewer components than computer 101, or a different combination of components than computer 101. Some implementations of the invention, for example, may employ one or more computing devices that are intended to have a very specific functionality, such as a digital music player or the server computer. These computing devices may thus omit unnecessary peripherals, such as the network interface 115, removable optical disk drive 119, printers, scanners, external hard drives, etc. Some implementations of the invention may alternately or additionally employ computing devices that are intended to be capable of a wide variety of functions, such as a desktop or laptop personal computer. These computing devices may have any combination of peripheral devices or additional components as desired.

In many examples, computers may define mobile electronic devices, such as smartphones, smart glasses, tablet computers, or portable music players, often operating the iOS, Symbian, Windows-based (including Windows Mobile and Windows 8), or Android operating systems.

With reference to FIG. 2, an exemplary mobile device, mobile device 200, may include a processor unit 203 (e.g., CPU) configured to execute instructions and to carry out operations associated with the mobile device. For example, using instructions retrieved from memory, the controller may control the reception and manipulation of input and output data between components of the mobile device. The controller can be implemented on a single chip, multiple chips or multiple electrical components. For example, various architectures can be used for the controller, including a dedicated or embedded processor, single purpose processor, controller, ASIC, etc. By way of example, the controller may include microprocessors, DSP, A/D converters, D/A converters, compression, decompression, etc.

In most cases, the controller together with an operating system operates to execute computer code and produce and use data. The operating system may correspond to well-known operating systems such iOS, Symbian, Windows-based (including Windows Mobile and Windows 8), or Android operating systems, or alternatively a special purpose operating system, such as those used for limited purpose appliance-type devices. The operating system, other computer code and data may reside within a system memory 207 that is operatively coupled to the controller. System memory 207 generally provides a place to store computer code and data that are used by the mobile device. By way of example, system memory 207 may include read-only memory (ROM) 209, random-access memory (RAM) 211. Further, system memory 207 may retrieve data from storage units which may include a hard disk drive, flash memory, etc. In conjunction with system memory 207, storage units 294 may include a removable storage device such as an optical disc player that receives and plays DVDs, or card slots for receiving mediums such as memory cards (or memory sticks).

Mobile device 200 also includes input devices 221 that are operatively coupled to processor unit 203. Input devices 221 are configured to transfer data from the outside world into mobile device 200. As shown, input devices 221 may correspond to both data entry mechanisms and data capture mechanisms. In particular, input devices 221 may include touch sensing devices 232 such as touch screens, touch pads and touch sensing, surfaces, mechanical actuators 234 such as button or wheels or hold switches, motion sensing devices 236 such as gyroscopes, accelerometers and magnetic compasses, location detecting devices 238 such as global positioning satellite receivers, based location detection functionality, or cellular radio based location detection functionality, force sensing devices 240 such as force sensitive displays and housings, image sensors 242 such as light cameras and/or IR cameras, and microphones 244. Input devices 221 may also include a clickable display actuator.

More specifically, in the presently described gesture recognition systems, input devices 221 include at least a 2D camera 243 (one of image sensors 242). 2D camera 243 can be a visible, light camera and/or a thermographic camera, such as those described above in reference to 2D camera 122. Accordingly, 2D camera 243 has the same functions and capabilities as those described above in reference to 2D camera 122.

Returning to FIG. 2, mobile device 200 also includes various output devices 223 that are operatively coupled to processor unit 203. Output devices 233 are configured to transfer data from mobile device 200 to the outside world. Output devices 233 may include a display unit 292 such as an LCD, speakers or jacks, audio/tactile feedback devices, light indicators, and the like.

Mobile device 200 also includes various communication devices 246 that are operatively coupled to the controller. Communication devices 246 may, for example, include both an I/O connection 247 that may be wired or wirelessly connected to selected devices such as through IR, USB, or Firewire protocols, a global positioning satellite receiver 248, and a radio receiver 250 which may be configured to communicate over wireless phone and data connections. Communication devices 246 may also include a network interface 252 configured to communicate with a computer network through various means which may include wireless connectivity to a local wireless network, a wireless data connection to a cellular data network, a wired connection to a local or wide area computer network, or other suitable means for transmitting data over a computer network.

Mobile device 200 also includes a battery 254 and possibly a charging system. Battery 254 may be charged through a transformer and power cord or through a host device or through a docking station. In the cases of the docking station, the charging may be transmitted through electrical ports or possibly through an inductance charging means that does not require a physical electrical connection to be made.

The various aspects, features, embodiments or implementations of the invention described above can be used alone or in various combinations. The methods of this invention can be implemented by software, hardware or a combination of hardware and software. The invention can also be embodied as the computer readable code on a computer readable medium (e.g. a nontransitory computer-readable storage medium). The computer readable medium is any data storage device that can store data which can thereafter be read by a computer system, including both transfer and non-transfer devices as defined above. Examples of the computer readable medium include read-only memory, random access memory, CD-ROMs, flash memory cards, DVDs, magnetic tape, optical data storage devices, and carrier waves. The computer readable medium can also be distributed over network-coupled computer systems so that the computer readable code is stored and executed in a distributed fashion.

Turning to FIG. 3, method 30 begins with initialization of the implementing device's camera in step 301 and motion sensors in step 302. Initialization of the motion sensors may include establishing a starting position to serve as a frame of reference for detection of motion in subsequent frames. Once initialized, the implementing device begins to capture a video stream from the camera in step 303, and in step 304 captures motion data from the motion sensors. The motion data from step 304 is next examined in step 305 to determine if a large camera movement has occurred relative to the previous frame. In step 306, if an unacceptably large movement is detected, the associated frame is ignored; if the movement is within an acceptable range, then the associated frame is retained. Finally, in step 307 the accepted frames are passed to any application or routine that will utilize the output video stream, preferably, an application that performs object and gesture recognition on the video.

Considering steps 304 and 305 in greater detail, information from the motion sensors is preferably sampled at a rate identical to the frame rate of the video stream in step 304. By doing so, motion data can be directly associated with each successive frame from the video stream, enabling detection of and determination of the amount of camera movement between each frame of the video stream. However, depending on the hardware used to implement the disclosed invention, motion data can also be sampled at a rate separate or independent from the camera frame rate. When the sampling rate is greater than the video stream frame rate, motion data samples recorded between two frames are ideally aggregated into a single value which represents the cumulative motion since the last captured frame of the video stream. This aggregated value is reset after use, so as to only reflect movements and position changes since the most recent captured frame. Where the sampling rate is slower than the video stream, a possible approach includes performing a trend analysis on the data and extrapolating values corresponding to the motion of each individual frame. The preferred end result of any approach yields motion data that corresponds with and can be tagged to each individual frame of the video stream.

Motion data ideally includes information from gyroscopic sensors, such as the angular shift of the camera, and can also include information from accelerometers, to indicate a linear shift, and even magnetic compasses and GPS receivers. The implementing device's motion sensors are used to determine when the camera is in motion and the motion's magnitude. For example, a gyroscopic sensor provides data on the current rate of angular rotation. A gyroscope on a device that is kept at a relatively constant attitude (not tilting, rolling, or yawing) will return values indicating little to no rate of change. A sudden attitude shift, e.g. a quick tilt, will momentarily register as a high angular change, followed by a return to a low or no rate of change when the gyroscope is held at a relative constant attitude. Likewise, an accelerometer will indicate a rate of acceleration in a given axis with some number greater than zero, with larger numbers indicating a greater amount of acceleration, and smaller numbers indicating little to no change in velocity. By attaching a gyroscope and/or accelerometer rigidly to an object such as a camera, changes in motion of the camera in space can be detected.

In step 305, this motion data is analyzed. If the detected angular rotation or acceleration exceeds a predetermined threshold, the frame is ignored or rejected in step 306. The predetermined amount is set based upon the application and algorithms that will be using the processed data stream. For typical gesture detection applications, a threshold in the range of five to 15 degrees angular shift, as detected by a gyroscope, has proven to be appropriate. For step 307, the rejected frames can either be deleted from the stream and not passed on to the receiving application or routine or can be flagged as being outside of the acceptable movement threshold. Alternatively, the last non-rejected (accepted) frame immediately prior in sequence to the rejected frame can simply be duplicated and inserted into the output video stream in place of the rejected frame. Where a series of frames are rejected in sequence, the last accepted frame is duplicated for each successive rejected frame, until a new accepted frame is reached.

Alternatively or in addition, motion data for a given frame can be compared against the motion data for the previous frame or frames in sequence prior to a given frame. Such a comparison can yield information about whether a movement is relatively continuous and smooth, such as when a camera is being panned and/or tilted intentionally, or a momentary movement more associated with a twitch or a jerk. Motion data can thus be used to detect and remediate unwanted camera movements that occur during a desired camera movement, such as when object recognition is being performed on a moving object being followed by the user. A user panning their head, in the case of a camera attached to a pair of smart glasses, to follow an object in sight would cause motion data indicating a steady motion over a relatively long number of frames, as compared to an occasional twitch. In such a situation, each frame's motion data can be compared with the previous frame to detect relative changes in motion. Thus, a jerk in panning movement may be detected by comparing the difference in motion between two frames against the predetermined threshold.

Where panning is steady, the angular motion detected by a gyroscope would be consistent from frame to frame (even if the motion data for a given frame would exceed the predetermined threshold), and a difference of the motion data between two frames would be close to zero. If the difference then exceeded the predetermined threshold, the frame could be rejected, and subsequent frames compared to the last accepted frame and rejected until the difference from the last accepted frame fell below the predetermined threshold. Furthermore, by tracking changes in motion data from frame to frame over a sequence of several frames, the initiation or discontinuance of an intentional camera movement can be detected if required by an application receiving the output video stream.

Figure 4:
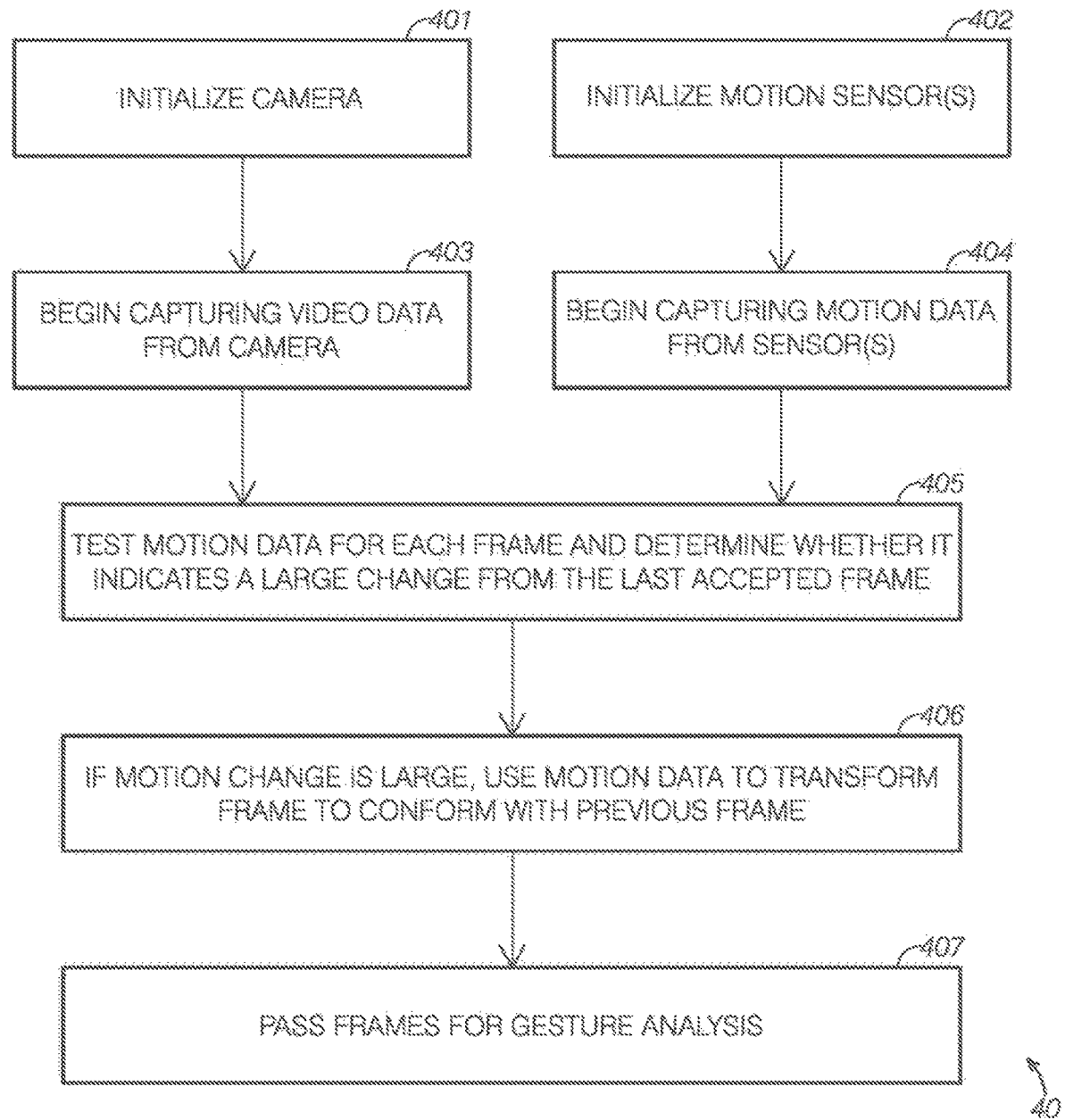
FIG. 4 is a flowchart of a second example method for compensating for camera movement for gesture detection and object recognition by a moving camera.

Turning attention to FIG. 4, a second example of a method 40 will now be described. Method 40 includes many similar or identical features to method 30. Thus, for the sake of brevity, each feature of method 40 will not be redundantly explained. Rather, key distinctions between method 40 and method 30 will be described in detail and the reader should reference the discussion above for features substantially similar between the two methods.

As can be seen in FIG. 4, method 40 includes steps 401 and 402 for initialization of the camera and motion sensors, steps 403 and 404 for the capture of video and motion data from the camera and motion sensors, and step 405 where the motion data is analyzed to determine the movement of each frame relative to its predecessor. However, in contrast to method 30, step 406 of method 40 involves using the captured motion data to correct the image's perspective, instead of disregarding any frames that exceed the motion size threshold. As with method 30, method 40 finally passes the video frames in an output video stream to a routine or application for gesture detection and recognition.

Considering the differing step 406, modifying the camera image based on input from the motion sensors, moving object in the field of view of the implementing device's camera can be tracked at the same time that the implementing device is in motion. Specifically, when the device's position and/or orientation is changing, successive images from the device's camera represent nonparallel 2D planes. Using information from gyroscopic sensors to determine camera tilt and pan change relative to the previous frame or the baseline established at sensor initialization (similar to as described above) the moved frame can be adjusted so as to create a perspective similar to the previous frame. Techniques for frame adjustments can combine image information from the current and previous frames to stitch together a new frame that has the movement minimized, by use of well-known perspective shifting techniques such as those implemented by image editing software like iPhoto® or Adobe Photoshop® for correcting keystoning, or any other method now known or later devised. Likewise, information from accelerometers can be used to compute how much the frame has shifted horizontally, vertically, or depth-wise to allow for appropriate cropping and refraining of the moved frame. These transformations allow for the isolation of moving portions of a captured scene from the background, which are then passed to the routine or application performing gesture detection and identification.

Where image stitching is used, the captured data from the motion sensors can be used as a reference for lining up the consecutive frames to seamlessly perform the stitching process. This helps provide a more accurate result than traditional image stitching techniques, where image features are typically matched up in an attempt to guess how the camera has shifted.

Methods 30 and 40 can be combined to provide a superior video stream for gesture detection and identification. Ideally, two different thresholds of motion are used: a lower motion threshold for the implementation of method 40, where frames are perspective and shift corrected, and an upper threshold, at which point method 30 is implemented and frames with a relatively large motion difference are ignored.

Figure 5:
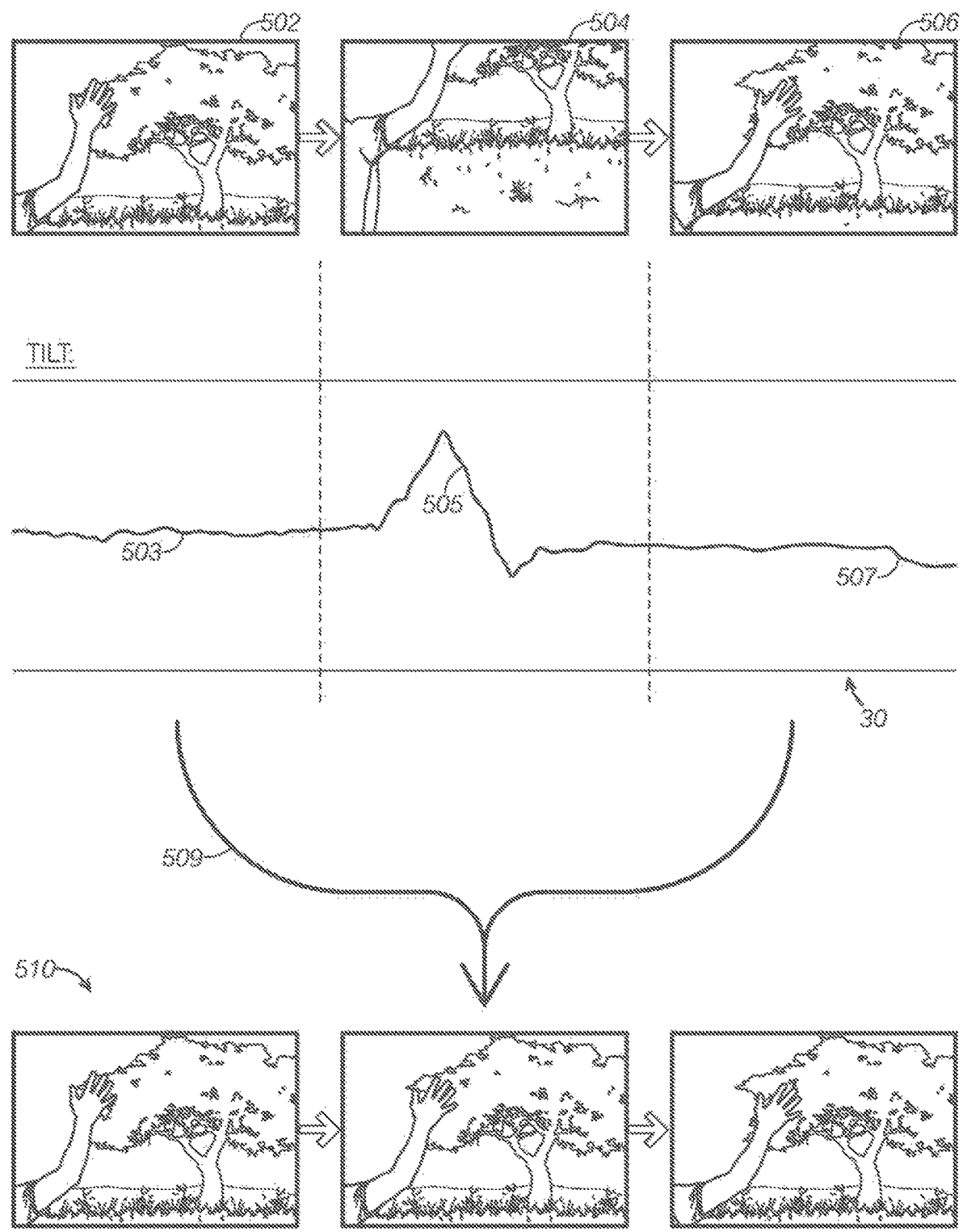
FIG. 5 is a diagram depicting an implementation of the first example of a method for compensating for camera movement for gesture detection and object recognition by a moving camera of FIG. 3.

FIG. 5 graphically depicts the results of method 30 described above and depicted in FIG. 3. A sequence of frames 502, 504 and 506 from a video camera are shown, along with the corresponding graphs of motion data 503, 505 and 507 from a motion sensor configured to detect camera tilt. As can be seen, frame 504 shows a picture that has a skewed perspective from surrounding frames 502 and 506, which is also detected by the motion sensor and depicted in the graph of motion data 505. A comparison of motion data 505 with motion data 503 would result in a difference that exceeds the preconfigured deletion threshold and consequently, frame 504 would be disregarded. Following disregarding of frame 504, motion data 507, associated with frame 506, would be compared with motion data 503 and, the camera having returned to substantially its original position, the comparison would be below the threshold indicating deletion, and frame 506 would be passed through to final video stream 510. Final video stream 510 would then be created by a merge 509 of frame 502, a duplicate of frame 502, and frame 506. As can be seen, final video stream 510 has a smooth sequence of frames, optimal for gesture detection or object recognition.

Figure 6:
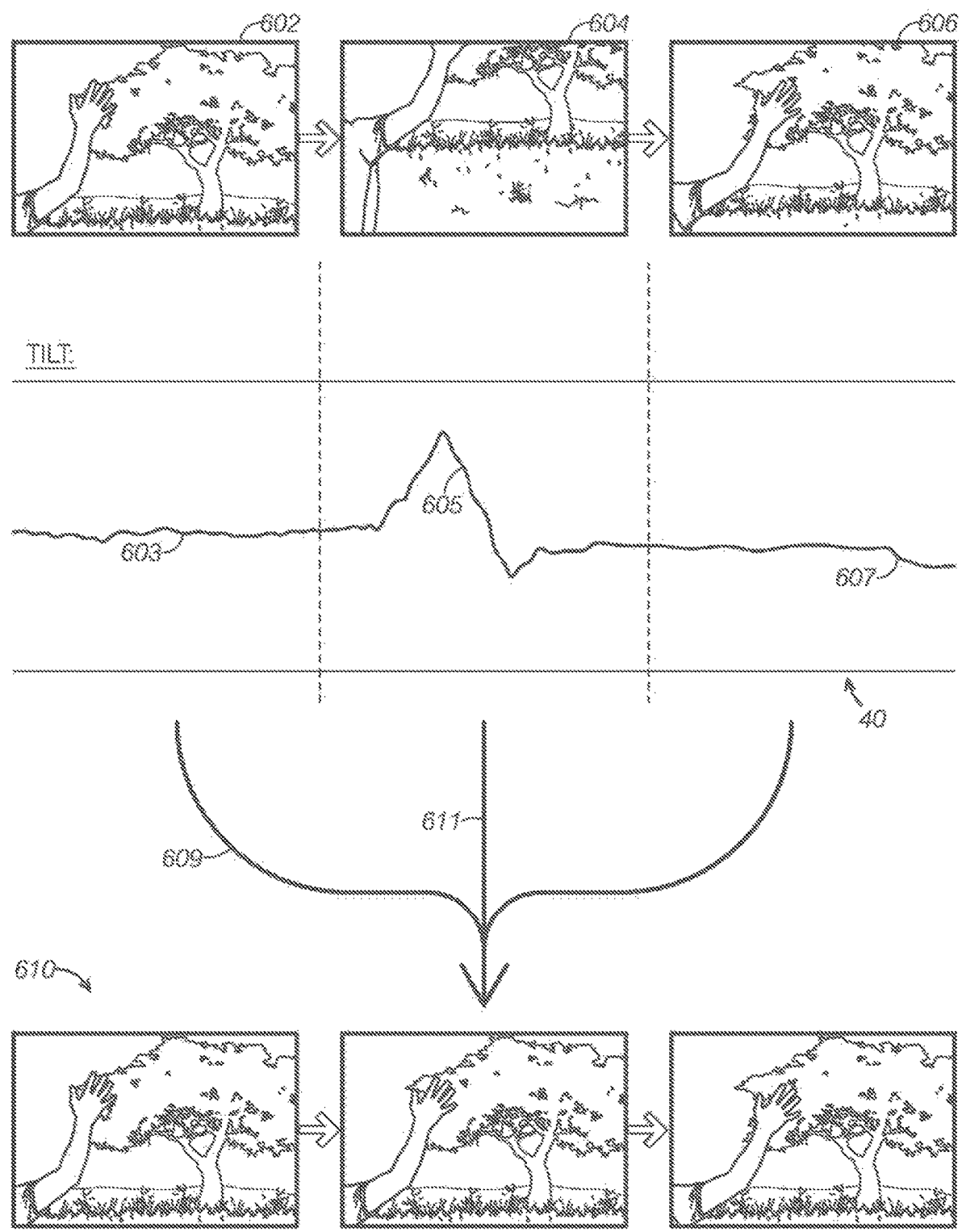
FIG. 6 is a diagram depicting an implementation of the second example of a method for compensating for camera movement for gesture detection and object recognition by a moving camera of FIG. 4.

In similar fashion, FIG. 6 graphically depicts the results of method 40 depicted FIG. 4. The sequence of frames 602, 604 and 606 are identical to the frames in FIG. 5, as is motion data 603, 605 and 607. In keeping with the steps of method 40, motion data 605 is compared against motion data 603 resulting in a comparison that exceeds the modification threshold. Motion data 605 is then used by the implementing hardware and software to recenter and reconstruct frame 604. Portions of frame 604 that may be missing due to improper camera angle can be pulled from frame 602, to construct a new frame 604 that approximates the angle of view presented in frames 602 and 606. The reconstructed frame is then passed through to final video stream 610. As in FIG. 5, motion data 607 for frame 606 is compared to motion data 603 and, having a difference that is below the modification threshold, frame 606 is passed through to final video stream 610 unchanged. Merge 609 depicts that, in addition to frames 602 and 606, the resulting adjusted frame 611 is also included in the final video stream 610, which is now optimal for gesture detection and object recognition.

It will be appreciated by a person skilled in the relevant art that methods 30 and 40 can be both implemented and used with a single data stream, using separate thresholds. For example, a lower modification threshold can be employed with an implementation of method 40, and a higher deletion threshold with an implementation of method 30. As a result, for undesired camera movements that exceed the modification threshold but not the deletion threshold, the flagged frames will be modified, while movements that exceed the deletion threshold, and thus potentially yield frames where modification would not be possible, would result in frames being deleted.

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A method, comprising:
    associating, by a processing device, a first frame of a set of frames with motion data that is captured approximately contemporaneously with the first frame;
    when a sampling rate of the motion data is greater than a frame rate of the set of frames, aggregating, by the processing device, a first sample of the motion data captured at the first frame and a second sample of the motion data captured between the first frame and a second frame of the set of frames to obtain a movement value;
    when the movement value does not exceed a first threshold value and exceeds a second threshold value, adjusting the first frame using at least one of the motion data associated with the first frame or at least a portion of a third frame that is previous to the first frame in the set of frames; and
    when the movement value exceeds the first threshold value rejecting, by the processing device, the first frame from the set of frames.

2. The method of claim 1, wherein the motion data is indicative of an amount of movement of an image capturing device when the image capturing device captured the first frame.

3. The method of claim 1, wherein the first threshold value is indicative of a threshold difference between a first image shown in the first frame and a second image shown in the second frame.

4. The method of claim 1, wherein the set of frames is a sequential series of frames from a video stream.

5. The method of claim 1, further comprising:
    receiving, from an image capturing device, the set of frames captured at the frame rate; and
    receiving, from a sensor, the motion data captured at the sampling rate.

6. The method of claim 1, further comprising replacing the first frame with a third frame that is previous the first frame in the set of frames when the movement value exceeds the first threshold value.

7. A method, comprising:
    associating, by a processing device, a first frame of a set of frames with motion data that is captured approximately contemporaneously with the first frame;
    when the movement value does not exceed a first threshold value and exceeds a second threshold value, adjusting the first frame using at least one of the motion data associated with the first frame or at least a portion of a third frame that is previous to the first frame in the set of frames; and
    when the first amount of movement of the image capturing device exceeds the first threshold value:
        identifying, by the processing device, a second frame previous to the first frame that does not exceed the first threshold value; and
        replacing, by the processing device, the first frame with the second frame.

8. The method of claim 7, further comprising:
    identifying a third frame subsequent to the first frame with a second amount of movement of the image capturing device that exceeds the first threshold value; and
    replacing the third frame with the second frame.

9. The method of claim 7, further comprising:
    receiving, from an image capturing device, the set of frames from a video stream; and
    receiving, from a sensor, the motion data.

10. The method of claim 9, wherein the sensor is physically attached to a housing of the image capturing device to detect the first amount of movement of the image capturing device.

11. The method of claim 7, wherein the motion data is indicative of an amount of movement of the image capturing device when the image capturing device captured the first frame.

12. The method of claim 7, further comprising removing the first frame from the set of frames when the first amount of movement of the image capturing device exceeds a second threshold value.

13. A system, comprising:
    an image capturing device configured to capture a set of frames;
    a sensor configured to capture motion data corresponding to movement of the image capturing device; and
    a processing device coupled to the image capturing device and the sensor, wherein the processing device is configured to:
        associate a first frame of the set of frames with the motion data;
        when the motion data exceeds a first threshold value, reject the first frame from the set of frames, wherein the motion data is indicative of an amount of movement of the image capturing device when the image capturing device captured the first frame; and
        when the motion data exceeds a second threshold value, adjust the first frame, wherein adjusting the first frame includes at least one of utilizing the motion data associated with the first frame or incorporating at least a portion of a second frame that is previous to the first frame into the first frame.

14. The system of claim 13, wherein the motion data is captured approximately contemporaneously with the first frame.

15. The system of claim 13, wherein:
- the motion data comprises at least one of angular rotation data of the image capturing device when the image capturing device captured the first frame or acceleration data of the image capturing device when the image capturing device captured the first frame; and
- the motion data exceeds the first threshold value when the angular rotation data exceeds a second threshold value or the acceleration data exceeds a third threshold value.

16. The system of claim 13, wherein the processing device is further configured to adjust the first frame when the motion data does not exceed the first threshold value and exceeds a second threshold value.

17. The system of claim 13, wherein the processing device is further configured to replace the first frame with a second frame previous to the first frame when the motion data exceeds the first threshold value, wherein the second frame was previously accepted by the processing device.

\* \* \* \* \*